(12) United States Patent
Hartong et al.

(10) Patent No.: US 8,707,461 B2
(45) Date of Patent: Apr. 22, 2014

(54) SCANNING METHOD FOR SCANNING A SAMPLE WITH A PROBE

(71) Applicant: FEI Company, Hillsboro, OR (US)

(72) Inventors: Arthur Reinout Hartong, Eindhoven (NL); Cornelis Sander Kooijman, Veldhoven (NL)

(73) Assignee: FEI Company, Hillsboro, OR (US)

( * ) Notice: Subject to any disclaimer, the term of this patent is extended or adjusted under 35 U.S.C. 154(b) by 0 days.

(21) Appl. No.: 13/655,200

(22) Filed: Oct. 18, 2012

(65) Prior Publication Data

US 2013/0254948 A1   Sep. 26, 2013

Related U.S. Application Data

(60) Provisional application No. 61/548,479, filed on Oct. 18, 2011.

(30) Foreign Application Priority Data

Oct. 18, 2011   (EP) ..................................... 11185586

(51) Int. Cl.
*G01Q 30/06* (2010.01)

(52) U.S. Cl.
USPC ................. 850/11; 250/306; 250/307; 850/8; 850/10

(58) Field of Classification Search
USPC ........................... 250/306, 307; 850/8, 10, 11
See application file for complete search history.

(56) References Cited

U.S. PATENT DOCUMENTS 7,816,648 B2 * 10/2010 Harada et al. ................. 250/311

FOREIGN PATENT DOCUMENTS

RU   2326367   6/2010

OTHER PUBLICATIONS

Cizmar, Petr, et al., 'New Imaging Method with Adaptive Averaging of Super-Fast SEM Images,' Scanning, May/Jun. 2008, pp. 277-278, vol. 30 No. 3.
Lapshin, R.V., 'A Method for Automatic Correction of Drift-Distorted SPM Images,' Journal of Surface Investigation, X-ray, Synchrotron and Neutron Techniques, 2007, pp. 630-636, vol. 1, No. 6.
Snella, Michael T., 'Drift Correction for Scanning-Electron Microscopy,' Sep. 2010, 92 pgs.

(Continued)

*Primary Examiner* — Michael Maskell
(74) *Attorney, Agent, or Firm* — Scheinberg & Associates, PC; Michael O. Scheinberg; Ki O

(57) ABSTRACT

The method relates to a method of scanning a sample. Scanning a sample is typically done by scanning the sample with a probe along a multitude of parallel lines. In prior art scan methods a sample is scanned multiple times with a nominally identical scan pattern. The invention is based on the insight that the coherence between adjacent points in a direction along the scan direction is much better than the coherence of adjacent points perpendicular to the scan direction. By combining two images that are scanned perpendicular to each other, it should thus be possible to form an image making use of the improved coherence (due to shorter temporal distance) in both directions. The method thus involves scanning the sample with two scan patterns, the lines of one scan pattern preferably perpendicular to the lines of the other scan pattern. Hereby it is possible to use the temporal coherence of scan points on a line of one scan pattern to align the lines of the other scan pattern, and vice versa.

17 Claims, 7 Drawing Sheets

(56) References Cited

OTHER PUBLICATIONS

Salmons, Brian S., et al., "Correction of Distortion Due to Thermal Drift in Scanning Probe Microscopy," Ultramicroscopy, 2010, pp. 339-349, vol. 110.
Shishido, Nobuyuki, et al., 'Accuracy Improvement of Full-field Displacement Measurement Using Digital Image Correlation for Images Obtained with a Laser Scanning Confocal Microscope,' Electronic Materials and Packaging, Nov. 19, 2007, pp. 1-5.
Luke, Sean, "Essentials of Metaheuristics (A Set of Undergraduate Lecture Notes)," 1st Ed. (Rev C), Online Version 1.3, Jul. 2011, ISBN: 978-0-557-14859-2, 241 pgs.
Kschischang, Frank R., et al., "Factor Graphs and the Sum-Product Algorithm," IEEE Transactions on Information Theory, Feb. 2001, p. 498-519, vol. 47, No. 2.
European Search Report, Dec. 15, 2011, 4 pages.

\* cited by examiner

SCANNING METHOD FOR SCANNING A SAMPLE WITH A PROBE

This application claims priority from U.S. Provisional Application 61/548,479, filed Oct. 18, 2011, which is hereby incorporated by reference.

The invention relates to a method of scanning a sample with a probe, the method comprising:

scanning the sample using at least two scan patterns;

while scanning the sample with the first scan pattern sequentially acquiring data resulting from said scanning and mapping the data obtained in a first memory area associated with the first scan pattern, the memory area comprising a multitude of memory locations, each memory location associated with a nominal scan position (x,y), while scanning the sample with the second scan pattern acquiring data resulting from said scanning and mapping the data obtained in a second memory area associated with the second scan pattern, the memory area comprising a multitude of memory locations, each memory location associated with a nominal scan position (u,v), forming an improved image by combining the data from the first and the second memory area and mapping the combined data in a memory area associated with the improved image, each point of the memory area associated with the improved image associated with a nominal scan position, Such a method is known from "New Imaging method with adaptive averaging of super-fast SEM images", P. Cizmar et al., Scanning Vol. 30, 3 (2008), p. 277-278, further referred to as Cizmar [1].

In a SEM a sample is scanned with a probe in the form of a focused beam of electrons. In response to said scanning radiation emerges from the sample, such as secondary electrons (SE's), backscattered electrons (BSE's), X-rays, and photons. This radiation is detected by detectors, such as an Everhart-Thornley detector, semiconductor detectors such as photodiodes, etc. As the position of the probe with respect to the sample is known, the detected signal can be mapped in an image memory, in which each memory location represents the intensity or amplitude of the detected signal (e.g. the amount of SE's) and each memory location is associated with a position of the probe with respect to the sample.

In the known publication first the problems of acquiring an image with a Scanning Electron Microscope (SEM) are discussed.

For a high signal-to-noise ratio a slow scan speed can be used, in which the probe dwells on one position for an extended period. When during this extended period the probe and the sample move with respect to each other, due to interferences, such as mechanical movement (vibrations), electric or magnetic fields, the memory location associated with a point on the sample will not only contain data from the nominal position, but also data (information) of adjacent positions. The result is an image with a high signal-to-noise ratio, but also showing blurring. Alternatively the memory locations may even contain only data from other than the nominal location, in which case the image shows so-called flagging.

When using a scan speed in which the frame time (the time in which an image is scanned once) is much less than the frequency of the interferences, the effect of the interferences can be neglected. This is approximated by scanning the sample at TV-rate, for example 25 frames per second. The problem when using such short frame times is that the S/N ratio is very poor.

In an effort to solve this Cizmar [1] proposes to combine several TV-rate images in such a way that drift between the images is corrected. Cizmar [1] proposes to store the different images in a separate memory areas, determine the shift vector of the images with respect to each other using for example correlation techniques, shift the images to the correct position and then add or average the corrected images.

A similar method is proposed in "A Method for Automatic Correction of Drift-Distorted SPM Images", R. V. Lapshin, Journal of surface investigation: X-ray, synchrotron and neutron techniques, Vol 1 No. 6 (2007), p 630-636, further referred to as Lapshin [2].

Lapshin [2] describes another scanning probe technique, in which a probe from a scanning probe microscope, such as a scanning tunneling microscope, is mechanically scanned over a surface. In this article it is proposed to scan the sample with a first scan in a first direction and then scan the sample in a direction opposite to the first direction, the so-called counter-scan.

This publication shows in its FIGS. 3 and 4 that two such counter scanned image pairs, one pair in which the scan is a horizontal scan and one pair in which the scan is a vertical scan, can be used to determine the drift vector and that this drift vector (which is presumed to be constant) is used to correct for image distortion and to form a combined image (see image 4c of said publication).

It is noted that this method is also described in (the abstract of) Russian Patent Publication Number RU2326367C2.

A similar method is proposed by Michael T. Snella in his thesis "Drift Correction for Scanning-Electron Microscopy", submitted to the Department of Electrical Engineering and Computer Science at the Massachusetts Institute of Technology, September 2010, further referred to as Snella [3].

Snella [3] proposes to take multiple images in a SEM, like the technique proposed by Cizmar [1], and proposes to determine the drift between images and correct for the drift in each of the images by shifting the lines of each image, and also correct for rotation of the images with respect to each other. These corrections are possible for interferences (drift) that are (almost) constant during a frame time, so that a linear drift can be assumed or a simple spline can be defined through the drift position as determined between subsequent images.

A problem in all of the above proposed methods is that interferences with variations with a variations times much less than the frame time (interference frequencies much higher than the frame rate) cannot be corrected for.

It is noted that for long frame times the above mentioned problems become more important as more interferences then have a period less than a frame time. Due to the higher resolution of images acquired nowadays, for example $10^3 \times 10^3$ pixels, equaling a total of $10^6$ pixels, frame times in excess of 1 second are normal. This means that all interferences with a period of (much) less than one second are not correctable with the above mentioned methods. It is to be expected that the need for still higher resolution images grows.

Another problem increasing above mentioned problems is the improvement of the resolution of the probe in many scan techniques. In for example Scanning Electron Microscopy (SEM) the resolution of the finely focused electron probe is now already below 1 nm, in Scanning Transmission Electron Microscopy (STEM) the resolution of the probe is sometimes already below 50 pm. Such small sizes necessitate a higher degree of attenuation of the interferences. This may lead to structural demands on the building in which such apparatuses are located, for example for vibration control, temperature control, ventilation control, acoustic isolation, etc., leading to high costs.

It is an object of the invention to provide a solution to the before mentioned problem and/or to reduce the costs associated with shielding of the interferences.

To that end the method according to the invention is characterized in that the two scan patterns show a set of multiple intersections where the scan patterns intersect at an angle, the intersections not necessarily coinciding with a nominal scan position, from which set a group of crossings C is selected, the position of each nominal scan position (x,y) acquired during the first scan is adjusted and the position of each nominal scan position (u,v) acquired during the second scan is adjusted, thereby defining a new set of intersections and a new group of crossings C, in such a manner that the similarity of the actual or interpolated data at the newly defined crossings is improved, the adjustment of each nominal scan position is governed by the adjustment of other scan positions using a weight factor that is a function of the temporal coherence between said nominal scan position and said other scan positions, the adjusted nominal scan positions (x,y) are used to map the data of the first memory area to one or more memory locations of the improved image and the adjusted nominal scan positions (u,v) are used to map the data of the second memory area to one or more memory locations of the improved image.

The invention is based on the insight that the coherence between adjacent points in the scan direction is much better than the coherence between adjacent points in a direction perpendicular to the scan direction. By combining two images with two scan patterns under an angle (preferably perpendicular to each other), it should thus be possible to form an image making use of improved coherence (due to shorter temporal distance) in both directions.

This is achieved by adjusting the position of each nominal scan position in such a manner that the data at the crossings (where data from two scan directions is available), or the interpolated data of the memory points associated with the crossings (if the crossings do not correspond with a nominal scan position), shows improved similarity. However, only shifting one point to another point with optimum similarity obviously does not work, as typically somewhere on the image a pixel with identical data value (grey value) will be present. Therefore the shift of a nominal scan position is governed (enabled) by the adjustment of other nominal scan positions using a weight factor that is a function of the temporal coherence of the other nominal scan positions: the nominal scan positions are thus made to move together when the temporal coherence is high.

Experiments and simulations showed that for the method to work properly often a maximum should be defined for the adjustments.

Finally the two images, one made with one scan pattern and the other with the other scan pattern, are combined.

However, due to the shifting it is well possible, and even likely, that some positions in the combined image have no associated data. The explanation is quite simple: due to interferences these positions of the sample have never been scanned, while other positions have been scanned more than twice. To form an image that 'pleases the eye' and can be used for normal interpretation, such empty positions in the combined image can be filled with interpolated/extrapolated data.

It is noted that, to reduce the amount of calculations, the group of crossings C can be a subset of all intersections It is further noted that this method is applicable to any method where data is sample (acquired) from a sample by scanning Some analysis methods using scanning are: scanning with a finely focused electron beam as is done in a Scanning Electron Microscope (SEM) or a STEM (Scanning Transmission Electron Microscope), scanning with a finely focused ion beam as is done in a Focused Ion Beam apparatus (FIB), scanning with a microscopic needle as is done in Scanning Probe Microscopy (SPM), including Scanning Tunneling Microscopy, Atomic Force Microscopy, Scanning Near-field Optical Microscopy, etc., scanning with an X-ray probe, or scanning with a probe of near IR, visible light or near UV, as can be derived from a laser beam. Also probes of charged particles from the group of charged molecules, clusters, and the like can be scanned over the sample in such a manner.

It is mentioned that it may be attractive, or even necessary, to normalize the contrast/brightness of the data acquired during each scan.

To determine the end of the optimization an abort criterion can be used, the abort criterion for example comprising a maximum number of iteration cycles, a maximum shift of the nodes determined in the last iteration, or the similarity of the data points of the two last obtained images of a scan. Also user intervention may be used as an abort criterion.

The problem of finding the optimum set of adjustments (or a set of adjustments approximating an optimum set), can be described as the problem to maximize a function (the similarity of the data points) with an input vector (all adjustments), where the input vector is of such as size that an exhaustive search is inefficient because the number of calculations needed increases exponentially with the number of variables. More efficient optimization methods for such problems originate from the field of metaheuristics. "Steepest ascent hill climbing" and "Belief propagation" have been applied to the problem successfully. Such methods are described in, for example, S. Luke: "Essentials of Metaheuristics (A Set of Undergraduate Lecture Notes)", $1^{st}$ Ed. (Rev C), Online Version 1.3 (July 2011), ISBN: 978-0-557-14859-2, further referred to as Luke [-4-].

The method is applicable to a probe that is scanned in a continuous movement over the sample, the data of a data point representing the integral over a part of the movement, but is also applicable to a probe that jumps from point to point, to dwell at a position while the movement between positions takes much less than the dwell time (e.g. less than 10% or even less than 1% of the dwell time).

In a preferred embodiment the at least two scan patterns show temporal overlap.

In this first one line of the first scan is scanned, then a line of the second scan pattern, then a line of the first scan pattern, etc. In this way temporal coherence between first and second scan pattern is higher than when combining the results of two sequential scan patterns, leading to improved results.

In a preferred embodiment each of the scan patterns is composed of parallel scan lines, the lines of one scan pattern perpendicular to the scan lines of the other scan pattern, and the weight factor is one for all points on a line and zero for all other points. Clearly the temporal coherence of points in a scan line is high: they are all sampled within one scan line period. By making the weight factor for all points on a line one, and zero for all other points, all points on a line are made to move together. This limits the amount of computing needed.

The effect is comparable to a high pass filter filtering the interferences with a time constant equaling twice the line time. All interferences with a period more than twice the line time are attenuated.

In another embodiment more than two scan patterns are used, at least one scan pattern forming intersections with at least two other scan patterns, thus forming at least two sets of intersections, from which at least two sets of intersections one group of crossings C is selected.

The group of crossings C can be selected from a multitude of sets of intersections, each set corresponding with the intersections of two scan patterns.

In yet another embodiment more than three scan patterns are used, and the scan patterns are combined pair wise to form a number of improved images, the number of improved images combined to form a final image.

It may be attractive to combine images pair wise. When acquiring a number of successive images image 1, image 2, image 3, etc, these may be combined by using image 1 and image 2 to form a first improved image, image 3 and image 4 to form a second improved image, and so on, and then combine the improved images in one final image. In this way it is possible to combine images that show for example a large shift with respect to each other without choosing a large predetermined maximum adjustment. This improves the time needed for the computation significantly without greatly reducing the improvement when compared to using intersections from all sets in the group of crossings C.

It is noted that the combining may include correction for shift and rotation of the improved images with respect to each other, a method known per se when combining images, see for example Snella [-3-].

The invention is now elucidated using figures, in which identical reference numerals relate to corresponding features.

BRIEF DESCRIPTION OF THE DRAWINGS

To this end:

FIG. 1a schematically shows a scan pattern as routinely used in for example a Scanning Electron Microscope (SEM), a Scanning Transmission Electron Microscope (STEM), a Focused Ion Beam machine (FIB), or a Scanning Probe Microscope (SPM).

Figure 1A:
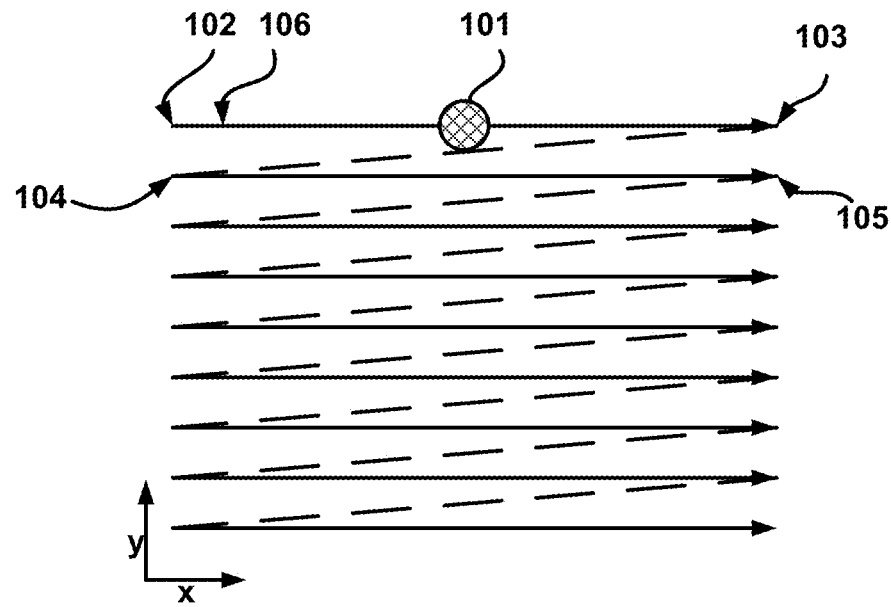
FIG. 1a schematically shows a first scan pattern.

A probe 101, such as a focused beam of charged particles (electrons, ion, charged molecules, or a charged cluster) is manipulated by deflecting electric or magnetic fields so that the position of said probe is scanned over the surface of a sample. The probe is first positioned at a start position 102. A first line is scanned by moving the probe towards position 103 in the x-direction. The line may be scanned in a smooth displacement, scanning the probe with a constant velocity over the sample, or the line may be scanned by hopping the probe from spot to spot, e.g. from start position 102 to position 106, keeping the spot at position 106 during a dwell time, and then displacing the spot rapidly to the next scan position along the scan line. In both cases the information gathered at or around position 106 is integrated and stored in one memory location.

At the end of the first line, the probe is rapidly moved from the end of the first line to the beginning of the second line, position 104, to be moved to position 105. Often the position 104 is adjacent to the start position 102 of the first line, but is also known that the scan direction of the second line is opposite to the scan direction of the first line.

It is noted that the probe preferably is moved rapidly from the end of the first line to the beginning of the second line to avoid charging, contamination and/or damage of the sample. It is known to blank the beam with a beam blanker to avoid charged particles impinging on the sample during the time it takes to move the scan position from the end of the first line to the beginning of the second line, during the so-called "flyback" time.

The second scan line is parallel to the first scan line, but slightly displaced in the y-direction. Preferably the distance between the scan lines is approximately equal to the diameter of the spot, as otherwise over- or under sampling occurs.

This is repeated until a large number of parallel lines is written

It will be clear that the temporal coherence between two adjacent points on the same line is very high. However, the temporal coherence between the first point of the first line and the last point of the last line is generally much worse, and for points scanned afterwards (in a next scan pattern) even worse. Any displacement of the actual scan position with respect to the nominal scan position, for example as a result of varying magnetic fields, electric fields, temperature changes resulting in thermal expansion, mechanical vibrations, acoustical interferences, pressure changes, etc., normally will have no or a very small influence on the relative position of two adjacent points in the scan direction, but will have a much larger effect for points that are sampled at moments in time that are, in time, more distant from each other and thus show less temporal coherence.

It is noted that scan times of a complete scan pattern typically range from much less than a second (for example $\frac{1}{25}^{th}$ of a second) to many seconds (e.g. more than 100 seconds). It is further noted that the number of scan positions N on each line and the number of lines N in a scan range from 512 to 2048 position or lines (although lower and higher numbers are in use), and tend to increase as computer memory and scan generators become cheaper, and computer monitors show higher resolution. In this example the number of points on a line and the number of lines in a scan pattern are assumed to be identical, resulting in a square image, but this need not be the case, resulting in a rectangular image.

Figure 1B:
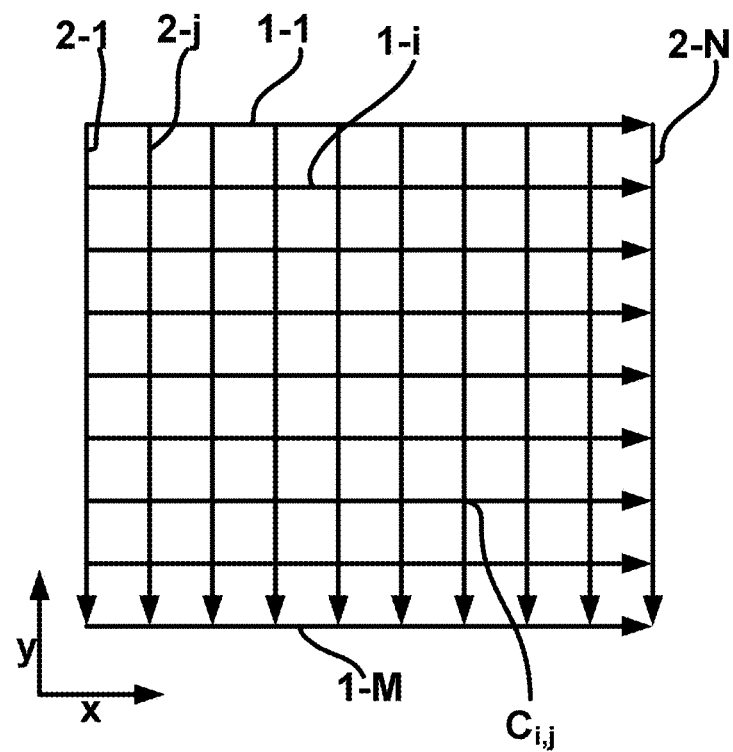
FIG. 1b schematically shows the first scan pattern with overlaid a second scan pattern, FIGS. 2a and 2b schematically show images acquired with the first and second scan pattern, respectively, FIG. 3 schematically shows shift vectors estimates as determined during successive iterations of "Steepest Ascent Hill Climbing"

FIG. 1b schematically shows the combination of a first scan pattern and a second scan pattern perpendicular to that.

The probe is first scanned or rastered over a number of horizontal lines 1-i, with i=1 . . . M, as described previously, and then the probe is rastered along a number of vertical scan lines 2-j, with j=1 . . . N. As a result of the second scan pattern being perpendicular to the first, a large number (N×M) of crossings $C_{ij}$ occur.

Figure 2A:
Figure 2B:

It is noted that the scan patterns can be simple rasters, as shown in FIG. 2b, but may be patterns showing so-named interlacing, or they may be combined in for example by first scanning a line of pattern 1, then a line of pattern 2, then a line of pattern 1 again, then a line of pattern 2, etc.

FIG. 2a schematically shows an image acquired with a first scan pattern, and FIG. 2b schematically shows an image acquired with a second scan pattern perpendicular to the first scan pattern.

FIG. 2a shows an image formed by scanning a sample with a scan pattern that consists of a large number of horizontal lines, the scan pattern shown in FIG. 1a. To this simulated image, that is derived from an existing image of 512×512 pixels, interferences are applied (added). Interferences corresponding to a simulated stochastic noise with an RMS spatial noise of 3 pixels are added to the well-known "Lena" image.

FIG. 2b shows a similar image formed by scanning with a scan pattern perpendicular to the scan pattern used in FIG. 2a. Again spatial noise with a RMS value of 3 pixels is added.

It is noted that these are simulated images, where only spatial noise is applied. Real-world images will also show other noise sources, such as intensity noise, while the type of positional noise may take different forms (stochastically, as used here, red, white or blue noise, frequency specific noise, for example as a result of a mechanical resonance, etc.).

Figure 3:
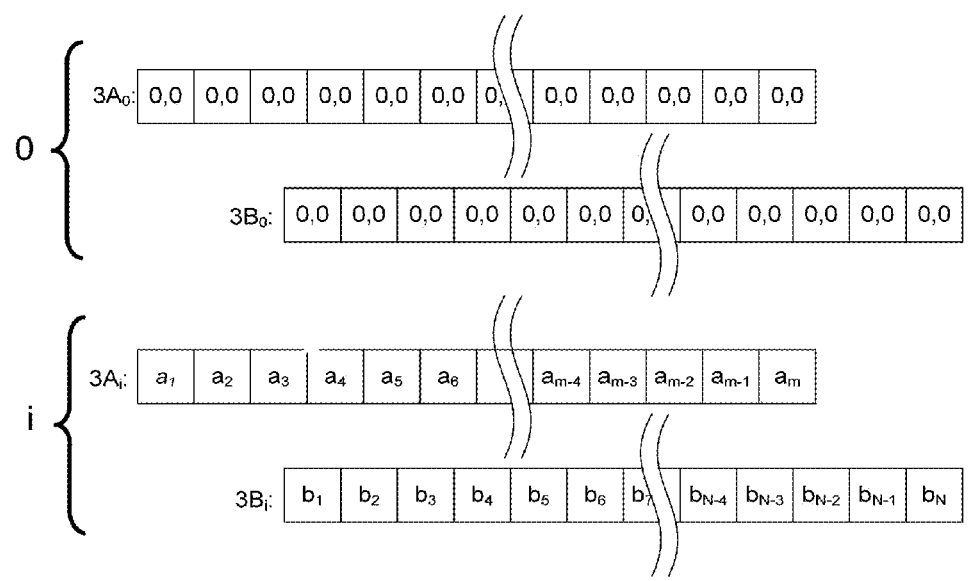

FIG. 3 schematically shows shift vectors estimates as determined during successive iterations of "Steepest Ascent Hill Climbing".

In "Steepest Ascent Hill Climbing" an optimum is searched by adjusting the position of each nominal scan position (x,y) and adjusting the position of each nominal scan position (u,v), looking for the maximum improvement by one such step at a time. The improvement is expressed by the similarity of the intensities at position (x,y) for each of the scans. Thereby a new set of intersections is defined and a new group of crossings C, in such a manner that the similarity of the actual or interpolated data at the newly defined crossings is optimized, until one or more predetermined abort criterions are reached, after which the adjusted position of the multiple locations adjusted is used to map the data of said locations to one or more memory locations of the memory area associated with the improved image.

This method is known as "Steepest Ascent Hill Climbing" as it determines the steepest hill (the largest derivative) and 'climbs' in that direction.

In this example the weight factor is one for all points on a line and zero for all other points. In this case all adjustments to nominal positions (x,y), on a line are replaced by a single shift vector $a^-$ for that line. All adjustments to nominal positions (u,v) on a line are replaced by a single shift vector $b^-$ for that line.

FIG. 3 shows a first set of coordinates of displacements of the crossings C, or shift vectors $a^-$ of all lines of one image in row 3A and the shift vectors $b^-$ of all lines of the other image in column 3B, with index 0 as it relates to the $0^{th}$ iteration. Before any evaluation the shift vectors for each line (each box in $3A_0$ and $3B_0$) are by definition (0,0), the null vector. During the first iteration for each line it is evaluated which of the shift vectors (0,0), (1,0), (0,1), (−1,0) or (0,−1) gives the best match in similarity of the data. This shift vector is now stored as the shift vector $a_1^-=(x_1, y_1)$ belonging to the first line (it is put in the box of $3A_1$). Likewise for all other lines of the first image the shift vectors $a_i^-$ is determined. Hereafter the values of $3A_0$ are not used anymore, but the values of $3A_1$ are used instead.

For the other image this is done as well, resulting results in a series of shift vectors $b_j^-$ After the first iteration a shift vector for each line in each of the images is thus determined, the shift being at most 1 pixel.

This process is now repeated in an iteration loop, where in the second iteration the shift of a line may become larger [for example (1,−1), or (−2,0)], or may be retracing its steps. This newly found shift vector replaces the previously found shift vector.

After a number of iterations i an abort criterion is reached, for example because no changes are made in the last iteration (all $a^-$, and $b_j^-$ unchanged), or because two solutions repeat themselves (flip-flopping between two solutions), or because a maximum number of iterations is reached. The thus found solution $a_i^-$ for each line of the first image and $b_j^-$ for each of the lines of the second image is used to shift the lines of the images of FIG. 2 so that images like the images of FIG. 7 are formed.

It is noted that typically the number of shift vectors of the first image equal the number of shift vectors in the second image (i=j). However, it is possible that the number of crossings in a horizontal direction differs from the number of crossings in a vertical direction, for example because the second scan comprises less lines than the horizontal scan, or because the subset of crossings C (not all intersections need be a crossing) is not organized as an square pattern.

It is further noted that in this example a choice is made between 5 vectors [ the shift vectors (0,0), (1,0), (0,1), (−1,0) and (0,−1)], but that a larger number may be used, for example including (1,1),(1,−1),(−1,1) and (−1,−1). Another variation could be that not a shift over a whole pixel is evaluated, but also over partial pixel shifts [for example (0,½)] combined with interpolated intensity values.

Figure 4:
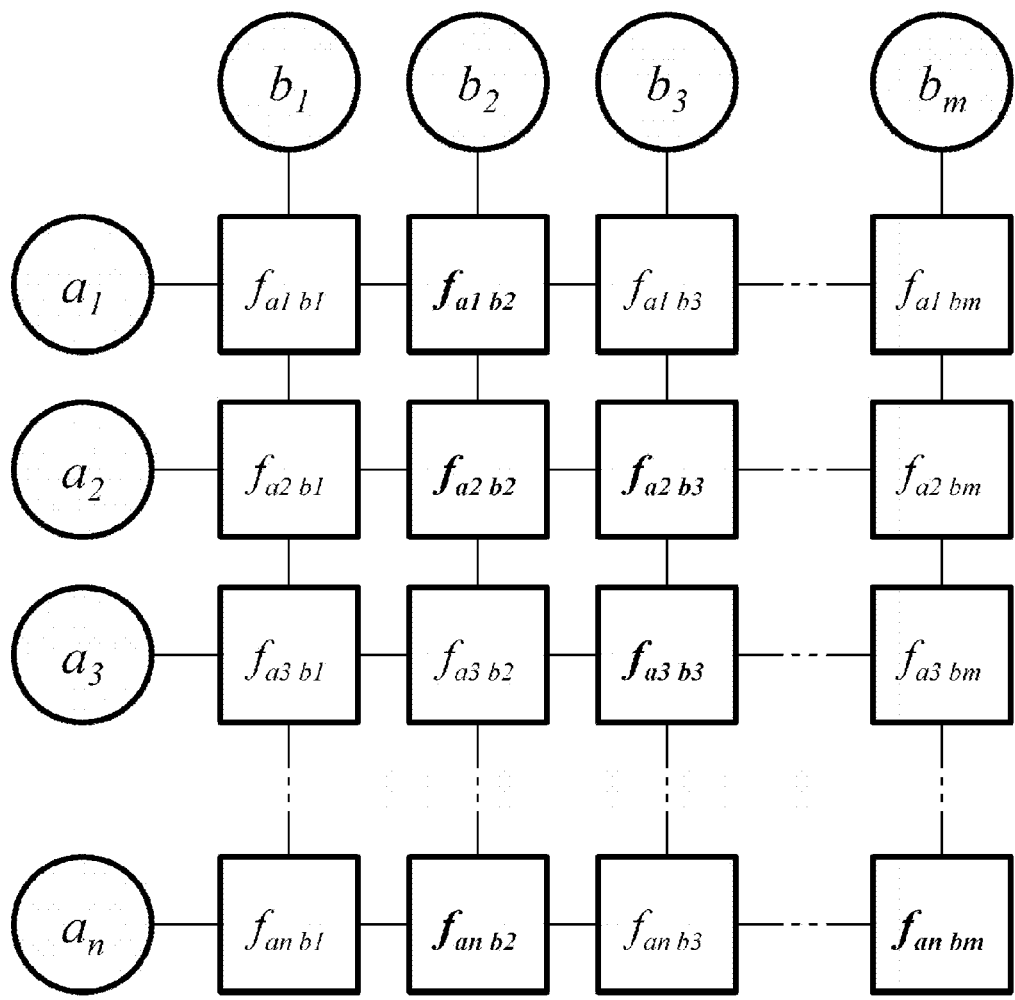
FIG. 4 shows the factor graph of the problem for the case where the weight factor is one for all points on a line and zero for all other points.

FIG. 4 schematically shows factor graphs used in an alternative solution method, the so-named "belief propagation". For a more detailed description of "Belief propagation" see F. R. Kschischang et al.: "Factor Graphs and the Sum-Product Algorithm", IEEE Transactions on information theory, Vol. 47, No. 2, (February 2001), p 498-519, further referred to as Kschischang [-5-].

It is noted that an explanation of factor graphs and belief propagation can also be found on Wikipedia.

Again the problem is simplified by choosing a weight factor that is one for all points on a line and zero for all other points. In this case all adjustments to nominal positions (x,y), on a line are replaced by a single shift vector $a^-$ for that line.

FIG. 4 shows the factor graph of the problem. Circles in the factor graph represent the shift-vectors. The square nodes represent the factorization of the function. Each factor node connects to no more than two shift vectors. For each combination of $a_i^-$ and $b_j^-$ an intersection exists with a resulting similarity measure, described by factor node $f_{\bar{a}_i \bar{b}_j}$. $\bar{a}_i$ propagates a belief to $b_j^-$ through $f_{\bar{a}_i \bar{b}_j}$.

Figure 5:
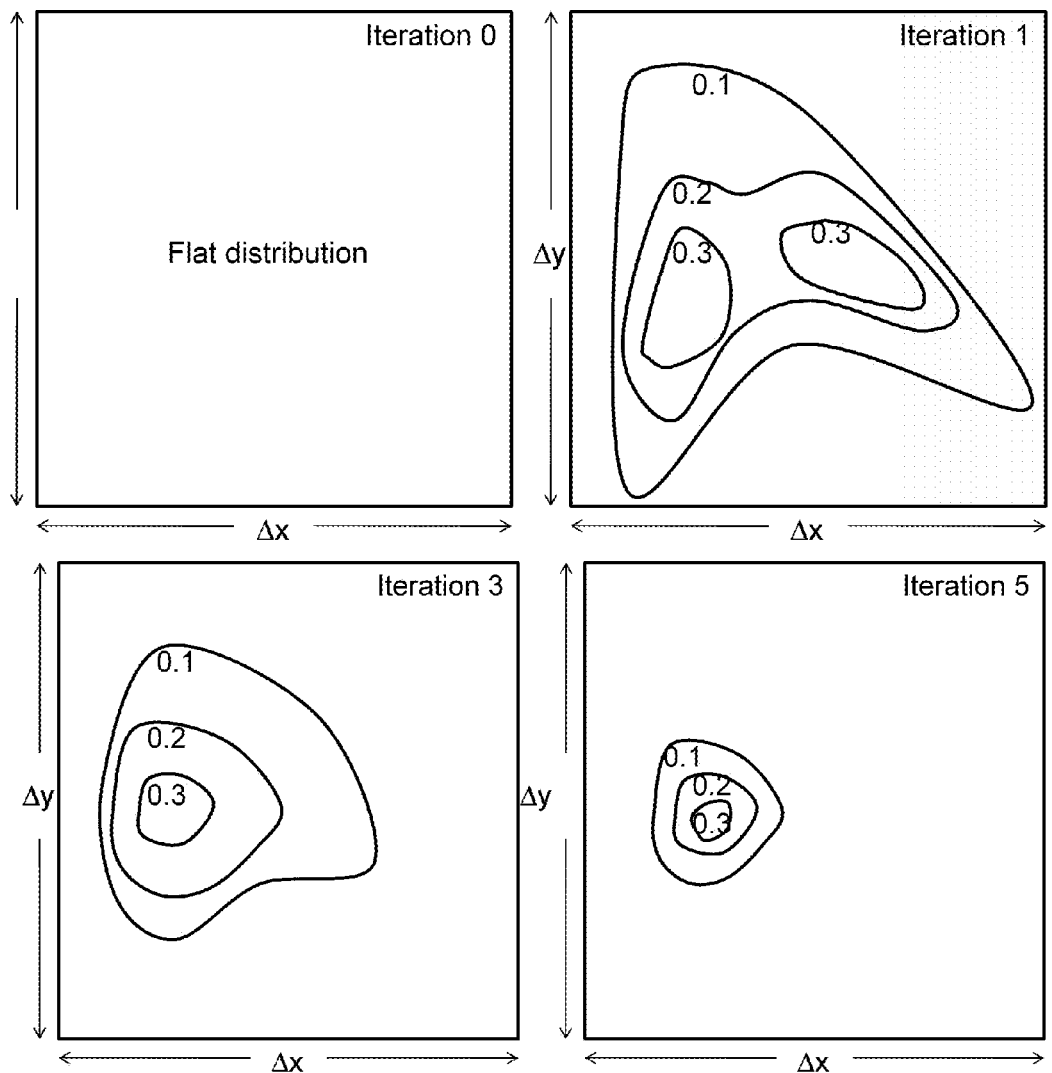
FIG. 5 illustrates progressive stages of the shift vector estimates during the successive iterations of belief propagation, FIGS. 6a and 6b schematically show the shift in x and y direction for each image line of the first image, rounded to the nearest integer, FIGS. 6c and 6d schematically show the shift in x and y direction for each image line of the second image, rounded to the nearest integer, FIGS. 7a and 7b schematically show the two images on which the shift correction of FIGS. 6a-d is applied to the images of FIGS. 2a and 2b, FIG. 8 schematically shows the image formed by combining the information of the two images, FIG. 9 schematically shows the combined image of FIG. 8 in which 'empty spaces' are interpolated.

FIG. 5 schematically shows progressive stages of the shift vector estimates during the successive iterations of belief propagation. Initially there are no assumptions about $a^-$ and $b^-$. The shift vectors, or marginal probability distributions, are flat. In the first iteration, an arbitrary line, for example the line with shift vector $b_1^-$, is chosen as a reference line. On this line $\bar{b}_1 = \bar{0}$ with certainty. This "belief" is propagated to all $a^-$ vectors, updating their marginal probability distributions. In the second iteration all of $a^-$ propagates to all of $b^-$. In the third iteration all of $b^-$ propagates to all of $a^-$. This process is repeated until a predefined abort criterion is reached, in this case a fixed number of iterations.

Figure 6A:
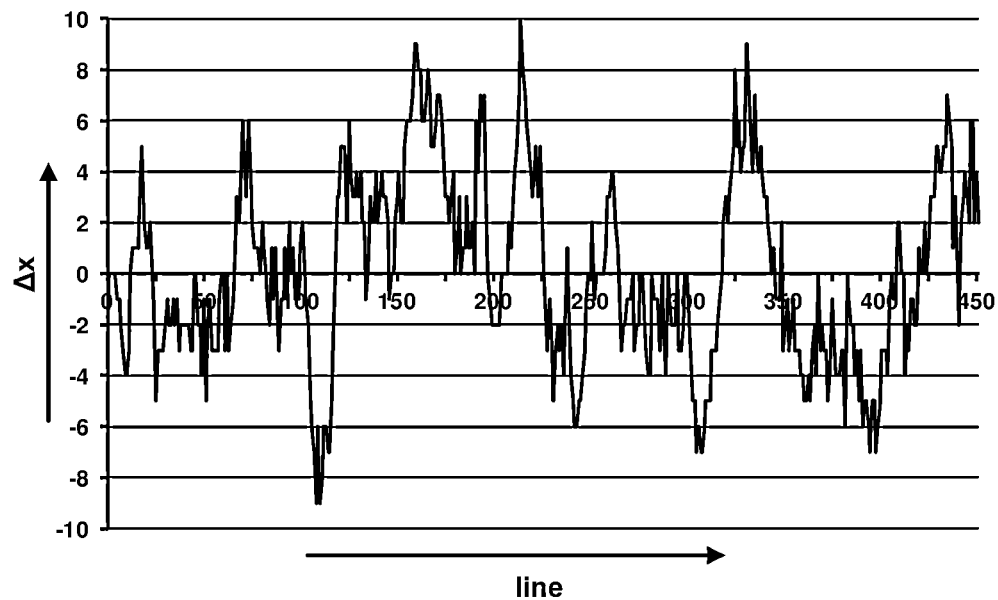
Figure 6B:
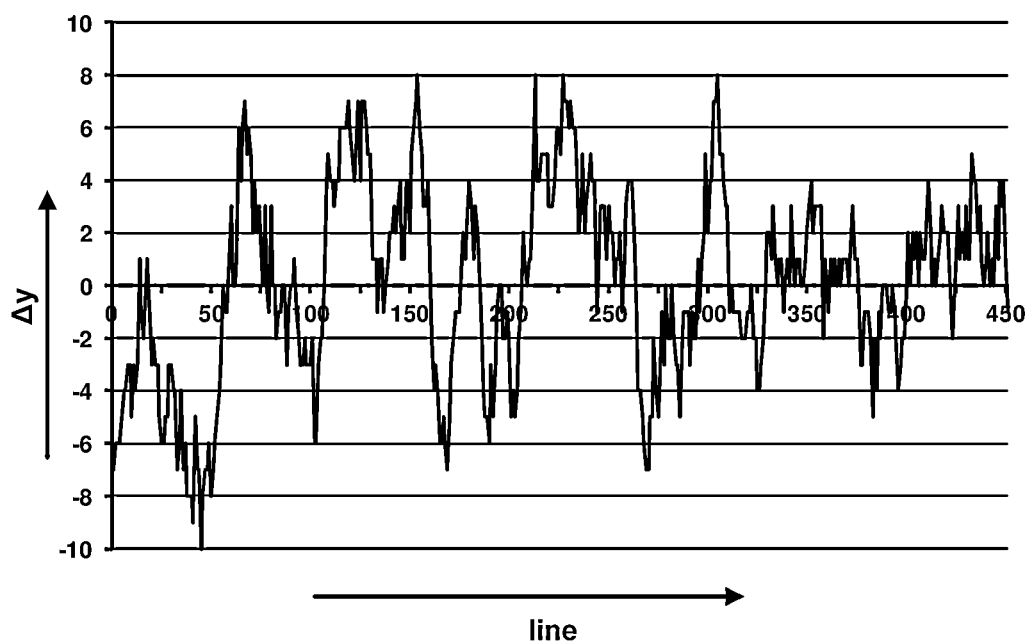
Figure 6C:
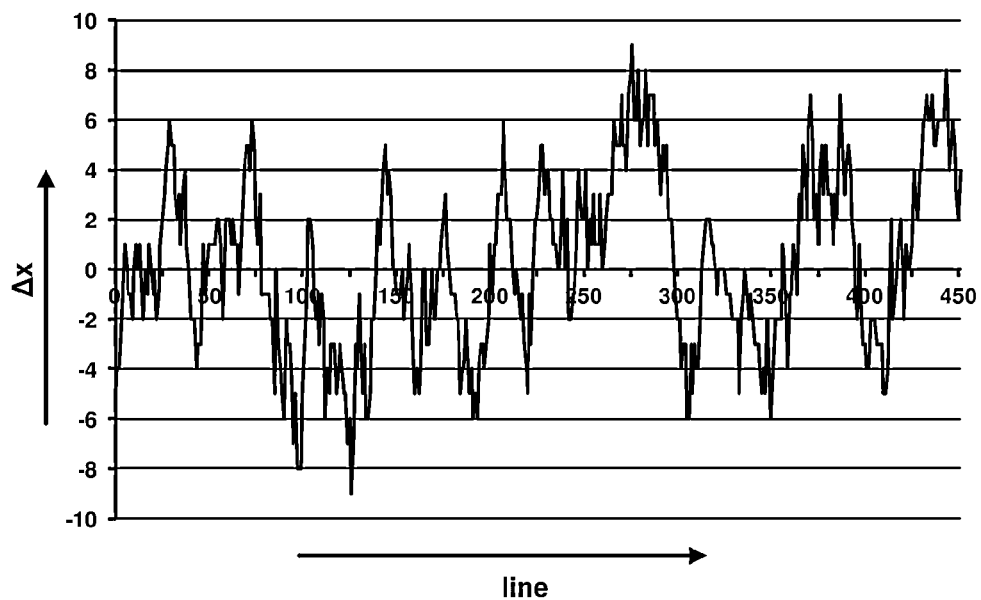
Figure 6D:
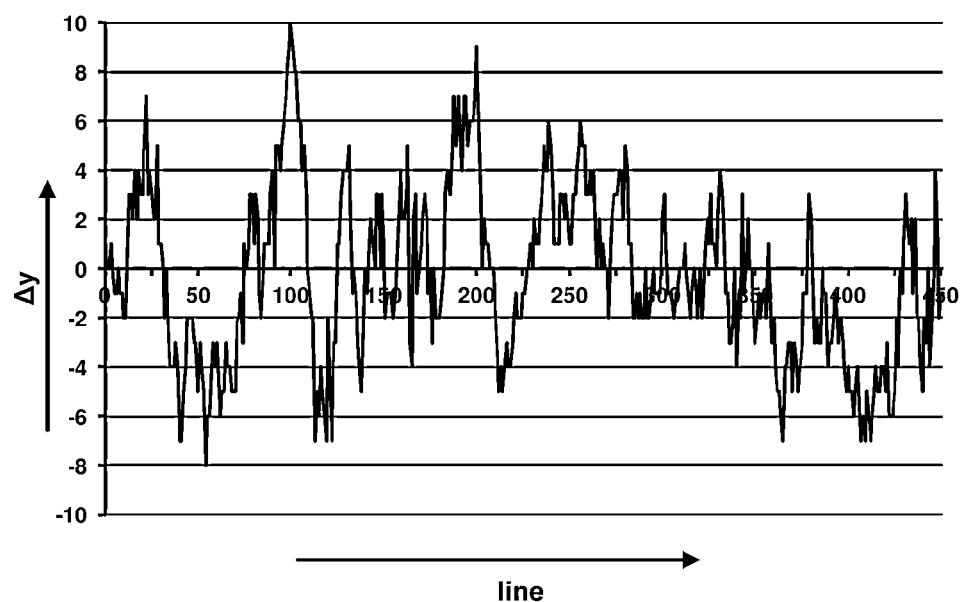

FIGS. 6a and 6b schematically show the displacement of the lines of FIG. 2a in the x and y position respectively (the horizontal lines), and FIGS. 6c and 6d schematically show the displacement of the lines of FIG. 2b (the vertical lines). Along the horizontal axis the line number is given, along the vertical axis the displacement in pixels. These particular set of displacements is calculated with a belief propagation method, but likewise displacements can be calculated with other methods, such as the earlier described "Steepest Ascent Hill Climbing".

Figure 7A:
Figure 7B:

FIG. 7a and FIG. 7b show the figures corresponding with FIGS. 2a and 2b, respectively, to which the shifts of FIG. 6 are applied.

Figure 8:

FIG. 8 shows the combination of FIGS. 7a and 7b. It is noted that many 'points do not comprise data from either FIGS. 7a and 7b, and are here depicted as black dots. These dots correspond to positions on the sample that have not been scanned, as a result of displacements due to interferences and, as such, are not artifacts.

Figure 9:

FIG. 9 is derived from FIG. 8, in which the points that did not comprise data (the black dots) are interpolated from neighboring points.

It is noted that other solution methods than "Steepest Ascent Hill Climbing" and "Belief propagation" can be used. Other examples are described or suggested in, for example, S. Luke [-4-]. It is also possible to use mixtures of these methods, for example first making a few iterations using one method and then proceeding with another method.

In the above examples the weight factor is chosen as one for all points or crossings on the same line as the crossing, and zero for all points or crossings on other lines. This effectively means that the lines are shifted integrally, as rigid sticks. It is well possible to define other weight factors, for example a weight factor that is one for all crossings that are acquired within a fixed period of the crossing (T=±Δt), or a weight factor W defined as, for example, W=(1−0.01 X), with X the distance along the scan direction expressed in pixels. In this way a 'rubber band' is used to tie the crossings together instead of a rigid connection.

REFERENCES

1: P. Cizmar et al: "New Imaging method with adaptive averaging of super-fast SEM images", Scanning Vol. 30, 3 (2008), p. 277-278.
2: R. V. Lapshin: "A Method for Automatic Correction of Drift-Distorted SPM Images", Journal of surface investigation: X-ray, synchrotron and neutron techniques Vol. 1 No. 6 (2007), p. 630-636.
3: M. T. Snella: "Drift Correction for Scanning-Electron Microscopy", thesis, submitted to the Department of Electrical Engineering and Computer Science at the Massachusetts Institute of Technology, (September 2010).
4: S. Luke: "Essentials of Metaheuristics (A Set of Undergraduate Lecture Notes)", $1^{st}$ Ed. (Rev C), Online Version 1.3 (July 2011), ISBN: 978-0-557-14859-2.
5: F. R. Kschischang et al.: "Factor Graphs and the Sum-Product Algorithm", IEEE Transactions on information theory, Vol. 47, No. 2, (February 2001), p 498-519.

We claim as follows:

1. A method of scanning a sample with a probe, the method comprising:
   scanning the sample using at least two scan patterns;
   while scanning the sample with the first scan pattern sequentially acquiring data resulting from said scanning and mapping the data obtained in a first memory area associated with the first scan pattern, the memory area comprising a multitude of memory locations, each memory location associated with a nominal scan position (x,y),
   while scanning the sample with the second scan pattern acquiring data resulting from said scanning and mapping the data obtained in a second memory area associated with the second scan pattern, the memory area comprising a multitude of memory locations, each memory location associated with a nominal scan position (u,v),
   forming an improved image by combining the data from the first and the second memory area and mapping the combined data in a memory area associated with the improved image, each point of the memory area associated with the improved image associated with a nominal scan position, wherein
   the two scan patterns show a set of multiple intersections where the scan patterns intersect at an angle, the intersections not necessarily coinciding with a nominal scan position, from which set a group of crossings C is selected,
   the position of each nominal scan position (x,y) acquired during the first scan is adjusted and the position of each nominal scan position (u,v) acquired during the second scan is adjusted, thereby defining a new set of intersections and a new group of crossings C, in such a manner that the similarity of the actual or interpolated data at the newly defined crossings is improved,
   measuring a temporal coherence between the nominal scan positions,
   the adjustment of each nominal scan position is governed by the adjustment of other nominal scan positions using a weight factor that is a function of the temporal coherence between said nominal scan position and said other nominal scan positions,
   the adjusted nominal scan positions (x,y) are used to map the data of the first memory area to one or more memory locations of the improved image and the adjusted nominal scan positions (u,v) are used to map the data of the second memory area to one or more memory locations of the improved image.

2. The method of claim 1 in which the probe is a probe of a scanning probe microscope, a focused charged particle beam, a focused X-ray beam or a beam of near-infrared light, visible light or near-ultraviolet light.

3. The method of claim 1 in which the at least two scan patterns are two scan patterns, each of the scan patterns comprising parallel line segments, the direction of the line segments in the two scan patterns perpendicular to each other.

4. The method of claim 1 in which the amplitude of the data obtained in each scan is normalized.

5. The method of claim 1 in which a metaheuristic method is used to improve the similarity of the actual or interpolated data.

6. The method of claim 5 in which the metaheuristic method used includes the methods of "Steepest ascent Hill climbing" and/or "Belief propagation".

7. The method of claim 5 in which one or more predetermined abort criterions are used to abort the metaheuristic method, the one or more predetermined abort criterions comprise a maximum number of iteration cycles, a maximum shift of the crossings C determined in the last iteration, or the similarity of the data points of the two last obtained images of one or more of the scan.

8. The method of claim 7 in which at least one of the scan patterns scans the probe to a multitude of scan positions, the probe held stationary at each of said scan positions during a dwell time, and the probe is moved between subsequent positions in a time period much shorter than the dwell time.

9. The method of claim 1 in which, after mapping data to image positions of the memory associated with the improved image, memory positions of the memory area associated with the improved image that have not been filled with data are filled with data that is interpolated from data that is in the improved image adjacent to said memory position.

10. The method of claim 1 in which the at least two scan patterns show temporal overlap.

11. The method of claim 1 in which the at least two scan patterns are two scan patterns, each of the scan patterns comprising parallel line segments, the direction of the line segments in the two scan patterns perpendicular to each other, and the weight factor equals one for all scan positions on one or more complete scan lines and equals zero for other scan lines.

12. The method of claim 1 in which more than two scan patterns are used, at least one scan pattern forming intersections with at least two other scan patterns, thus forming at least two sets of intersections, from which at least two sets of intersections one group of crossings C is selected.

13. The method of claim 1 in which the set of intersections equals the group of crossings C.

14. The method of claim 1 in which more than three scan patterns are used, at least two scan patterns nominally identical, and the scan patterns are combined pair wise to form a number of improved images, the number of improved images combined to form a final image.

15. The method of claim 14 in which the combining includes correction of shift and rotation of the improved images with respect to each other.

16. A method of scanning a sample with a probe, the method comprising:

scanning the sample with a microscope probe using a first and second scan patterns, said scans having a set of nominal scan positions and multiple lines wherein the first and second scan patterns intersect at an angle, the intersections not necessarily coinciding with the nominal scan positions;

acquiring data from said scans;

measuring a temporal coherence between the nominal scan positions, nominal scan positions being changed by a weight factor that is a function of a temporal coherence between said nominal scan positions; and using the adjusted nominal scan positions to form an image.

17. The method of claim 16 wherein the adjusted nominal scan positions are used to map the data into memory locations.

* * * * *